(12) United States Patent
Abraham et al.

(10) Patent No.: US 6,590,750 B2
(45) Date of Patent: *Jul. 8, 2003

(54) LIMITING MAGNETORESISTIVE ELECTRICAL INTERACTION TO A PREFERRED PORTION OF A MAGNETIC REGION IN MAGNETIC DEVICES

(75) Inventors: David William Abraham, Ossining; Philip Edward Batson; John Slonczewski, both of Katonah, all of NY (US); Philip Louis Trouilloud, Mahwah, NJ (US); William Joseph Gallagher, Ardsley, NY (US); Stuart Parkin, San Jose, CA (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/021,352

(22) Filed: Feb. 10, 1998

(65) Prior Publication Data

US 2001/0040778 A1 Nov. 15, 2001

Related U.S. Application Data

(63) Continuation-in-part of application No. 08/758,614, filed on Nov. 27, 1996, now Pat. No. 5,764,567, which is a continuation-in-part of application No. 08/618,300, filed on Mar. 18, 1996, now Pat. No. 5,650,958.

(51) Int. Cl.$^7$ .................................................. G11B 5/39
(52) U.S. Cl. .................................. 360/324.2; 360/324.1
(58) Field of Search ............................ 360/113, 324.2, 360/324.1; 324/252; 338/32 R; 365/171, 173, 158

(56) References Cited

U.S. PATENT DOCUMENTS 5,341,118 A 8/1994 Parkin et al. ............. 338/32 R (List continued on next page.)

FOREIGN PATENT DOCUMENTS

| JP | 10-4227 | * | 1/1998 |
| WO | WO 98/34231 | | 8/1998 |

OTHER PUBLICATIONS

Fernandex, P.J., et al., "Magnetic Force Microscopy of Single–Domain Cobalt Dots Patterned Using Interference Lithography," IEEE Transactions on Magnetics, vol. 32, No. 5, (Sep. 1996), pp. 4472–4474.

(List continued on next page.)

*Primary Examiner*—Jefferson Evans
(74) *Attorney, Agent, or Firm*—Marian Underweiser, Esq.; Kevin P. Radigan, Esq.; Heslin Rothenberg Farley & Mesiti P.C.

(57) ABSTRACT

Magnetoresistive devices are disclosed which include a changeable magnetic region within which at least two magnetic states can be imposed. Upon magnetoresistive electrical interaction with the device, the relative orientation of the magnetic states of the changeable magnetic region, and a proximate reference magnetic region, can be sensed thereby providing a binary data storage capability. The present invention limits the electrical interaction to only a preferred portion of the changeable magnetic region, e.g., the portion within which the two magnetic states can be dependably predicted to be substantially uniform, and opposite of one another. Structures for limiting the electrical interaction to this preferred portion of the changeable magnetic region are disclosed, and include smaller interaction regions, and alternating areas of insulation and conductive, interaction regions, disposed proximate the changeable magnetic region. The principles of the present invention can be applied to magnetic random access memory ("MRAM") arrays, which employ giant magnetoresistive ("GMR") cells, or magnetic tunnel junction ("MTJ") cells, at the intersections of bitlines and wordlines, and also to magnetic sensors such as magnetic data storage devices having access elements used to access data on a magnetic data storage medium.

34 Claims, 13 Drawing Sheets

U.S. PATENT DOCUMENTS

| | | | |
|---|---|---|---|
| 5,408,377 A | | 4/1995 | Gurney et al. ............... 360/113 |
| 5,640,343 A | | 6/1997 | Gallagher et al. ........... 365/171 |
| 5,650,958 A | | 7/1997 | Gallagher et al. ........... 365/173 |
| 5,668,688 A | * | 9/1997 | Dykes et al. ............... 360/113 |
| 5,715,121 A | * | 2/1998 | Sakakima et al. ....... 360/324.2 |
| 5,748,524 A | | 5/1998 | Chen et al. ................. 365/173 |
| 5,764,567 A | * | 6/1998 | Parkin ........................ 365/173 |
| 5,793,697 A | * | 8/1998 | Sheuerlein ............. 365/230.07 |
| 5,828,598 A | | 10/1998 | Chen et al. ................. 365/158 |
| 5,835,003 A | * | 11/1998 | Nickel et al. ............. 338/32 R |
| 5,835,314 A | * | 11/1998 | Moodera et al. ............ 360/113 |
| 5,838,608 A | | 11/1998 | Zhu et al. ................... 365/158 |
| 5,841,692 A | * | 11/1998 | Gallagher et al. ........... 365/173 |
| 5,898,547 A | * | 4/1999 | Fontana, Jr. et al. ........ 360/113 |
| 5,936,402 A | * | 8/1999 | Schep et al. ................. 324/252 |
| 5,946,228 A | * | 8/1999 | Abraham et al. ............ 365/173 |
| 5,986,858 A | * | 11/1999 | Sato et al. .................. 360/113 |
| 6,021,065 A | * | 2/2000 | Daughton etg al. ......... 365/158 |
| 6,077,618 A | * | 6/2000 | Sakakima et al. ........... 324/252 |

OTHER PUBLICATIONS

Zheng, Y. & Zhu, J., "Micromagnetic Phinciples in Pseudo Spin Valve Memory Element Design," *IEEE Transactions on Magnetics*, vol. 33, No. 5, (Sep. 1997), pp. 3286–3288.

* cited by examiner

LIMITING MAGNETORESISTIVE ELECTRICAL INTERACTION TO A PREFERRED PORTION OF A MAGNETIC REGION IN MAGNETIC DEVICES

CROSS REFERENCE TO RELATED APPLICATIONS

This Application is a continuation-in-part of U.S. patent application Ser. No. 08/758,614 filed Nov. 27, 1996, entitled "MAGNETIC TUNNEL JUNCTION DEVICE WITH NONFERROMAGNETIC INTERFACE LAYER FOR IMPROVED MAGNETIC FIELD RESPONSE", now U.S. Pat. No. 5,764,567, issued Jun. 9, 1998, which is a continuation-in-part of application Ser. No. 08/618,300 filed Mar. 18, 1996, which is now U.S. Pat. No. 5,650,958 issued Jul. 22, 1997, and relates to the following commonly assigned, issued U.S. Patents:

1. U.S. Pat. No. 5,640,343, issued Jun. 17, 1997 and entitled "MAGNETIC MEMORY ARRAY USING MAGNETIC TUNNEL JUNCTION DEVICES IN THE MEMORY CELLS"; and
2. U.S. Pat. No. 5,650,958, issued Jul. 22, 1997 and entitled "MAGNETIC TUNNEL JUNCTIONS WITH CONTROLLED MAGNETIC RESPONSE."

This Application relates to the following commonly assigned, concurrently filed U.S. Patent Applications:

1. application Ser. No. 09/021,342, filed Feb. 10, 1998 and entitled, "MAGNETIC MEMORY DEVICES HAVING MULTIPLE MAGNETIC TUNNEL JUNCTIONS THEREIN";
2. application No. 09/021,515 filed Feb. 10, 1998 and entitled, "INTENTIONAL ASYMMETRY IMPOSED DURING FABRICATION AND/OR ACCESS OF MAGNETIC TUNNEL JUNCTION DEVICES"; and
3. application Ser. No.09/021,569, filed Feb. 10, 1998 and entitled, "LIMITING MAGNETIC WRITING FIELDS TO A PREFERRED PORTION OF A CHANGEABLE MAGNETIC REGION IN MAGNETIC DEVICES now U.S. Pat. No. 5,946,228, issued Aug. 31, 1999."

Each of these U.S. Patents and U.S. Patent Applications is a continuation-in-part of U.S. Pat. application Ser. No. 08/758,614 filed Nov. 27, 1996 entitled "MAGNETIC TUNNEL JUNCTION DEVICE WITH NONFERROMAGNETIC INTERFACE LAYER FOR IMPROVED MAGNETIC FIELD RESPONSE", now U.S. Pat. No. 5,764,567, issued Jun. 9, 1998, and is hereby incorporated by reference herein in its entirety now U.S. Pat. No. 5,946,228, issued Aug. 31, 1999.

STATEMENT OF GOVERNMENT RIGHTS

The Government of the United States of America has rights in this invention pursuant to Contract No. MDA972-96-C-0030 awarded by the Defense Advanced Research Projects Agency.

TECHNICAL FIELD

This invention relates to the fabrication and access of magnetic devices used in, for example, magnetic memory cells in a magnetic random access memory ("MRAM").

BACKGROUND OF THE INVENTION

Magnetic Random Access Memory ("MRAM") arrays of the type disclosed in the two above-incorporated U.S. Patents, and depicted in FIGS. 1a–b herein, include an array of magnetic memory cells (e.g., cell 9) positioned at the intersections of wordlines 1, 2, 3 and bitlines 4, 5, 6. Each cell includes a magnetically changeable or free region 24, and a proximate magnetic reference region 20, arranged into a magnetic tunnel junction ("MTJ") device 8. The principle underlying storage of data in such cells is the ability to change the relative orientation of the magnetization of the free and reference regions by changing the direction of magnetization along the easy axis ("EA") of the free region, and the ability to thereafter read this relative orientation difference.

More particularly, an MRAM cell is written by reversing the free region magnetization using applied bi-directional electrical and resultant magnetic stimuli via its respective bitline and wordline, and is later read by measuring the resultant tunneling resistance between the bitline and wordline, which assumes one of two values depending on the relative orientation of the magnetization of the free region with respect to the reference region. (The term reference region is used broadly herein to denote any type of region which, in cooperation with the free or changeable region, results in a detectable state of the device as a whole.) If the free region is modeled as a simple elemental magnet having a direction of magnetization which is free to rotate but with a strong preference for aligning in either direction along its easy axis (+EA or −EA), and if the reference region is a similar elemental magnet but having a direction of magnetization fixed in the +EA direction, then two states (and therefore the two possible tunneling resistance values) are defined for the cell: aligned (+EA/+EA) and anti-aligned (−EA/+EA).

An ideal hysteresis loop characterizing the tunnel junction resistance with respect to the applied EA field is shown in FIG. 2. The resistance of the tunnel junction can assume one of two distinct values with no applied stimulus in region 50, i.e., there is a lack of sensitivity of resistance to applied field below the easy axis flipping field strength $\pm H_c$ in region 50. If the applied easy axis field exceeds $\pm H_c$, then the cell is coerced into its respective high resistance (anti-aligned magnetization of the free region with respect to the reference region) or low resistance (aligned magnetization of the free region with respect to the reference region) state.

Even if the magnetization pattern of the two regions forming the tunnel junction is simple, reversing the direction of magnetization in the free region during writing can actually affect one or both regions in unexpected ways. For example, the reversal of the free region during writing can result in the inclusion of a magnetic vortex or complex magnetic domain walls, pinned by a defect or by edge roughness. Because the junction resistance depends on the dot product $m_{free}m_{reference}$ averaged over the junction area, inclusion of such complex micromagnetic structures in the magnetization pattern can substantially corrupt the measured tunnel junction resistance during reading.

For example, shown in FIG. 3 is the magnetization pattern in a free magnetic region 59 formed symmetrically about its easy axis EA in which a complicated wall structure is clearly evident between otherwise acceptable magnetization pattern regions. This overall magnetization pattern was attained from a nominally uniformly magnetized sample (both top and bottom layers originally pointing to the right), for which the easy axis bias was swept from +700 Oe to −700 Oe and back to +700 Oe. The reversal of magnetization evolved to a complicated structure as the field was swept from +700 Oe down to about −280 Oe. FIG. 4 is a hysteresis loop depicting the net direction of magnetization averaged over the device versus applied easy axis field for this corrupt sample. The non-square nature of region 50, resulting in a cell which will not predictably assume either one of its two states upon the removal of the easy axis applied field, is due to the evolution of such complex micromagnetic structures in the cell.

Some improvements in this situation are possible. For example, in the above-incorporated U.S. Patent Application entitled "INTENTIONAL ASYMMETRY IMPOSED DURING FABRICATION AND/OR ACCESS OF MAGNETIC TUNNEL JUNCTION DEVICES," the present inventors have disclosed a technique for avoiding the evolution of some of the undesirable micromagnetic structures in typical MRAM cells. Substantial improvements have been demonstrated, and in the best of cases no wall structures evolve during the cycling of fields used for reversing magnetization. However, as shown in the free region 69 of FIG. 5, for even these improved conditions, there can still be a substantial twist in the magnetization pattern. This twist causes the undesirable, rounded shape in the resistance versus field hysteresis loop shown in FIG. 6.

Though the problems discussed above relate to magnetic tunnel junction devices, similar problems exist in any magnetic device in which a magnetoresistive effect is used as a basis for electrical interaction (e.g., giant magnetoresistive ("GMR") devices). This interaction is broadly referred to herein as magnetoresistive electrical interaction.

The non-ideal behavior in the magnetization reversal process in such devices results in a reduction in the useful parametric window of operation at best, or a total collapse of the square hysteresis loop necessary for storage at worst. What is required, therefore, is an improvement in the electrical performance of a well-behaved magnetoresistive device even if the magnetization patterns in the free region do not uniformly assume a single one of two possible directions of magnetization.

SUMMARY OF THE INVENTION

The present inventors have realized that the electrical and magnetic properties of magnetoresistive devices are to some extent separable. The electrical interaction region, for example, a tunneling region, can therefore be modified to allow regions thereof to be more or less electrically conductive, while leaving the overall magnetic structure and evolution patterns of the device virtually unchanged. This modification enables the limiting of the electrical interaction with the device to a preferred portion of the free magnetic region, thereby minimizing or completely eliminating the effects of the above-described, undesirable magnetization patterns in other portions of the free region.

In that regard, the present invention, in one aspect, relates to a magnetoresistive device, having a first magnetic layer formed in conjunction with at least one other structure in said device, such that upon magnetoresistive electrical interaction therewith, said electrical interaction (e.g., electrical tunneling) occurs only through a preferred portion of the first magnetic layer and not any remaining portion thereof. The first magnetic layer may be changeable into one of at least two substantially opposing magnetic states along an axis thereof, and the preferred portion of the first magnetic layer may be centered about a midpoint of the axis. The preferred portion of the first magnetic layer may be less than 50% of the size of the first magnetic layer measured in a first lateral dimension parallel to the axis.

To limit the electrical interaction only to the preferred portion of the first magnetic layer, the at least one other structure in the device may be an electrical interaction region smaller than the first magnetic layer and arranged in a conductive relationship to the preferred portion of the first magnetic layer, thereby effecting electrical interaction only through the preferred portion of the first magnetic layer, and not the remaining portion thereof. The at least one other structure in the device may also comprise an electrically insulating region arranged in an insulating relationship to the remaining portion of the first magnetic layer, but not the preferred portion thereof, thereby effecting electrical interaction only through the preferred portion of the magnetic layer and not the remaining portion thereof.

The magnetoresistive device can be used as a magnetic memory cell in a magnetic memory, or as an access element adapted to access data on a magnetic data storage medium.

In another aspect, the present invention relates to a method for accessing a magnetoresistive device having a first magnetic region changeable into each of two magnetic states. The method includes limiting electrical interaction to only a preferred portion of the first magnetic region, and not any remaining portion thereof. The preferred portion of the first magnetic region comprises a region wherein each of two magnetic states into which the region is changeable can be dependably predicted to be substantially uniform and opposite of one another.

The method may include using an electrical interaction region formed to effect electrical interaction only through the preferred portion of the first magnetic region and not the remaining portion thereof. This may be accomplished by forming the interaction region to be electrically conductive proximate to the preferred portion of the first magnetic region, and using insulation formed to prevent electrical interaction through the remaining portion of the first magnetic region.

In yet another aspect, the present invention relates to a method for forming a magnetoresistive device, including forming an electrical interaction region through which electrical interaction will occur upon access of said device. A first magnetic layer changeable into each of two magnetic states is formed proximate to, and larger than, the interaction region such that upon said access said electrical interaction will occur only through a preferred portion of the first magnetic layer, determined by the resultant position of the interaction region proximate to which the first magnetic layer is formed, and not any remaining portion thereof.

The formation of the interaction region may include decreasing an electrically insulative effect in a given region of an otherwise insulating region thereby forming the interaction region in the given region. Decreasing the electrically insulating effect in the given region may include providing less electrical insulation in the given region.

The formation of the interaction region may also include forming electrical insulation in areas at least partially around the interaction region to prevent electrical interaction in these areas and therefore in the remaining portion of the first magnetic layer. The electrical insulation may be formed by depositing the insulation in these areas at least partially around the interaction region, or by ion-implanting these areas to convert the areas from an otherwise non-insulating material into an insulating material, while isolating the interaction region from the ion-implanting, thereby maintaining an electrically conductive characteristic of the interaction region.

By limiting electrical interaction to only a preferred portion of the free magnetic region, within which the direction and uniformity of the two states of magnetization can be dependably predicted, the resultant resistance response, and therefore the overall electrical interaction response, is improved.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following detailed description of the preferred embodiment(s) and the accompanying drawings in which:

DETAILED DESCRIPTION OF THE PREFERRED EMBODIMENTS

Figure 1A:
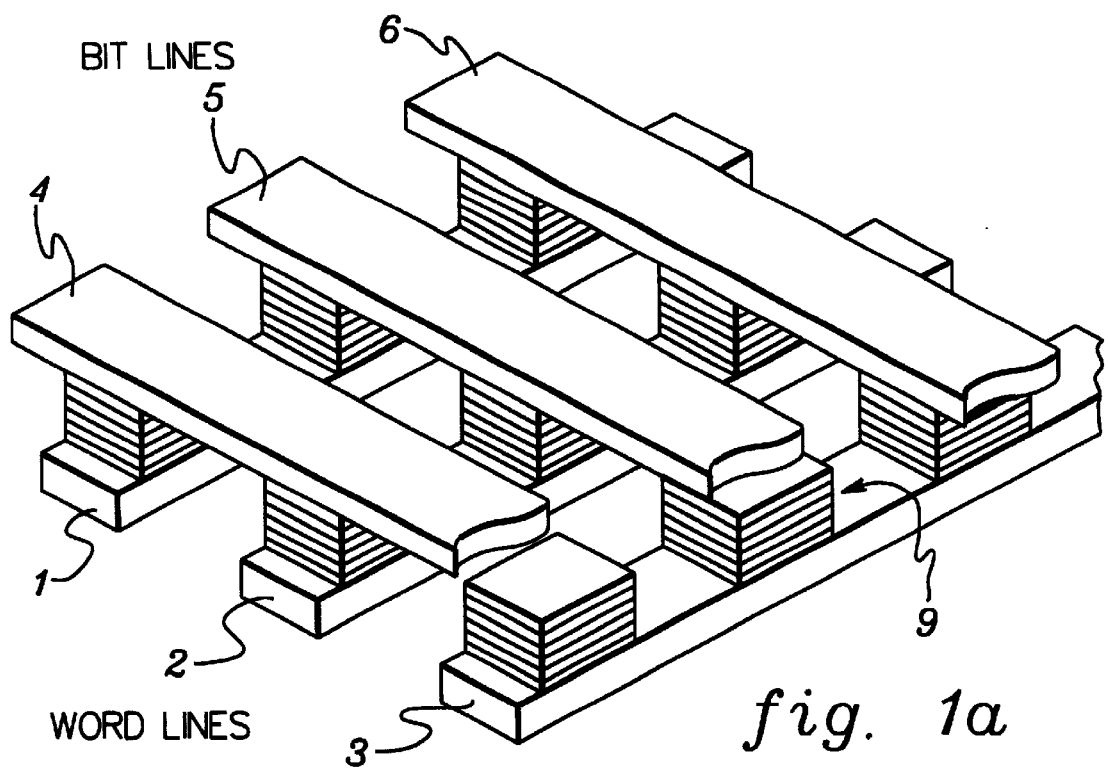
FIGS. 1a–b depict an MRAM array having a plurality of magnetic memory cells at the intersections of crossing bitlines and wordlines, and an individual magnetic tunnel junction memory cell, respectively.
Figure 1B:
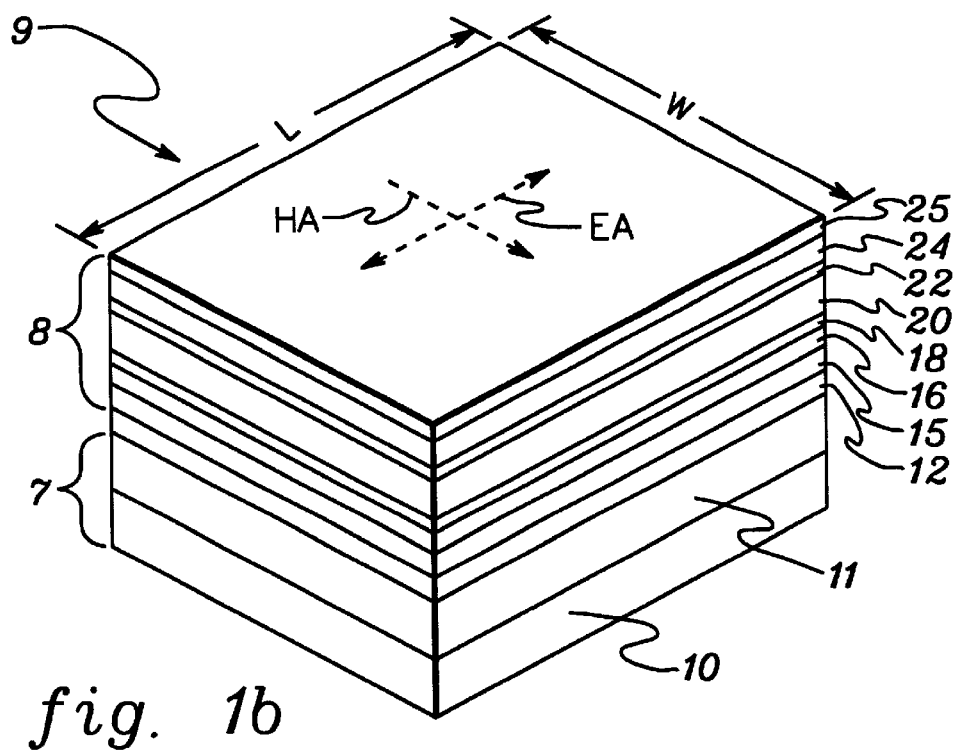
Figure 2:
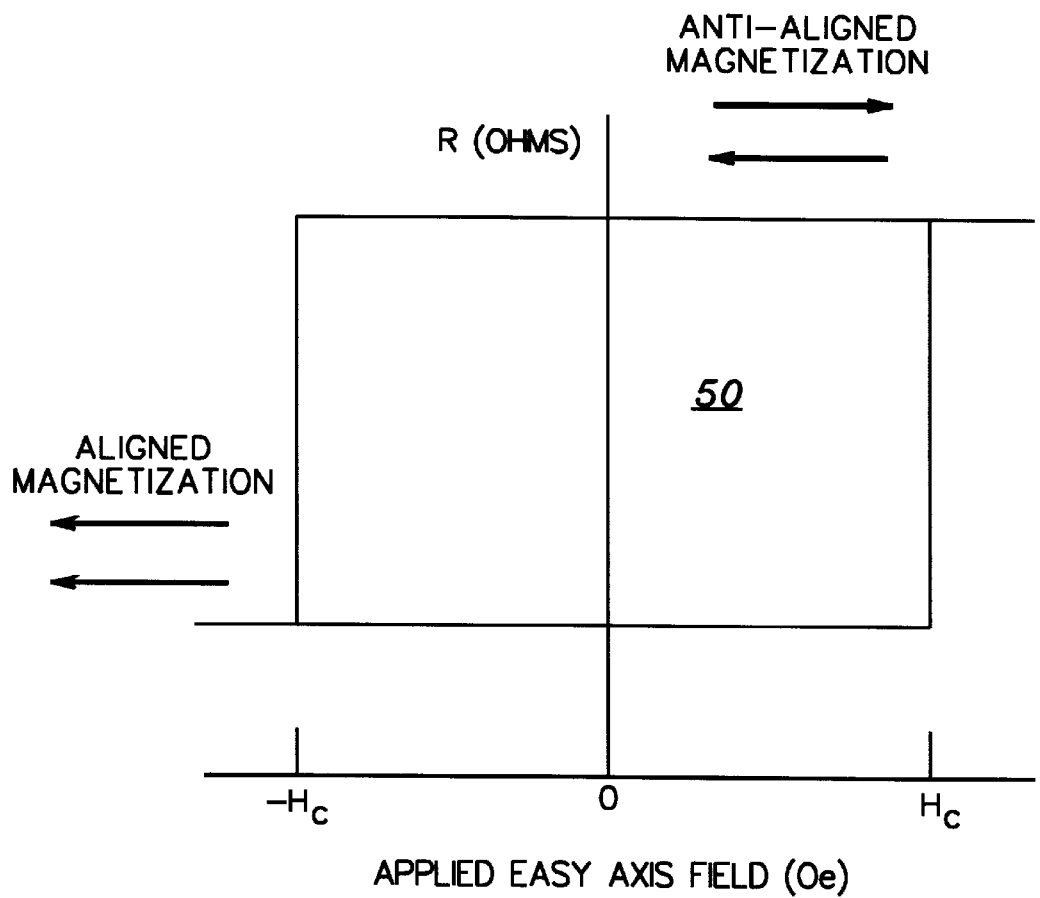
FIG. 2 is an ideal hysteresis loop of the measured resistance versus applied easy axis field for an ideal magnetic tunnel junction device.
Figure 3:
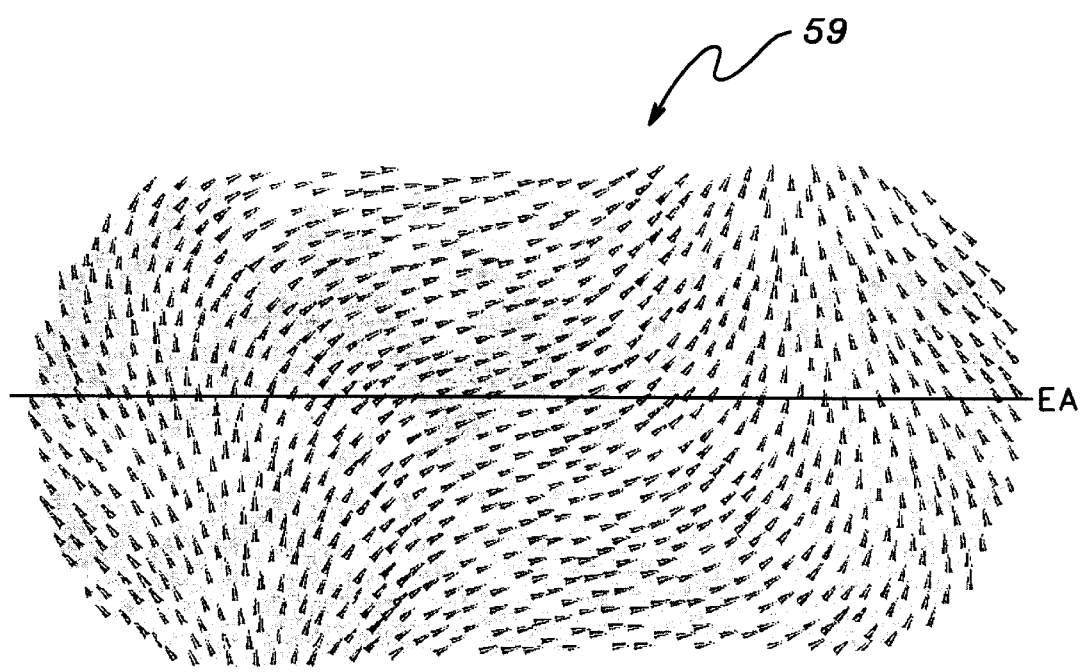
FIG. 3 depicts a magnetization pattern of a sample, symmetrically formed free magnetic region, having a complex micromagnetic wall structure therein.
Figure 4:
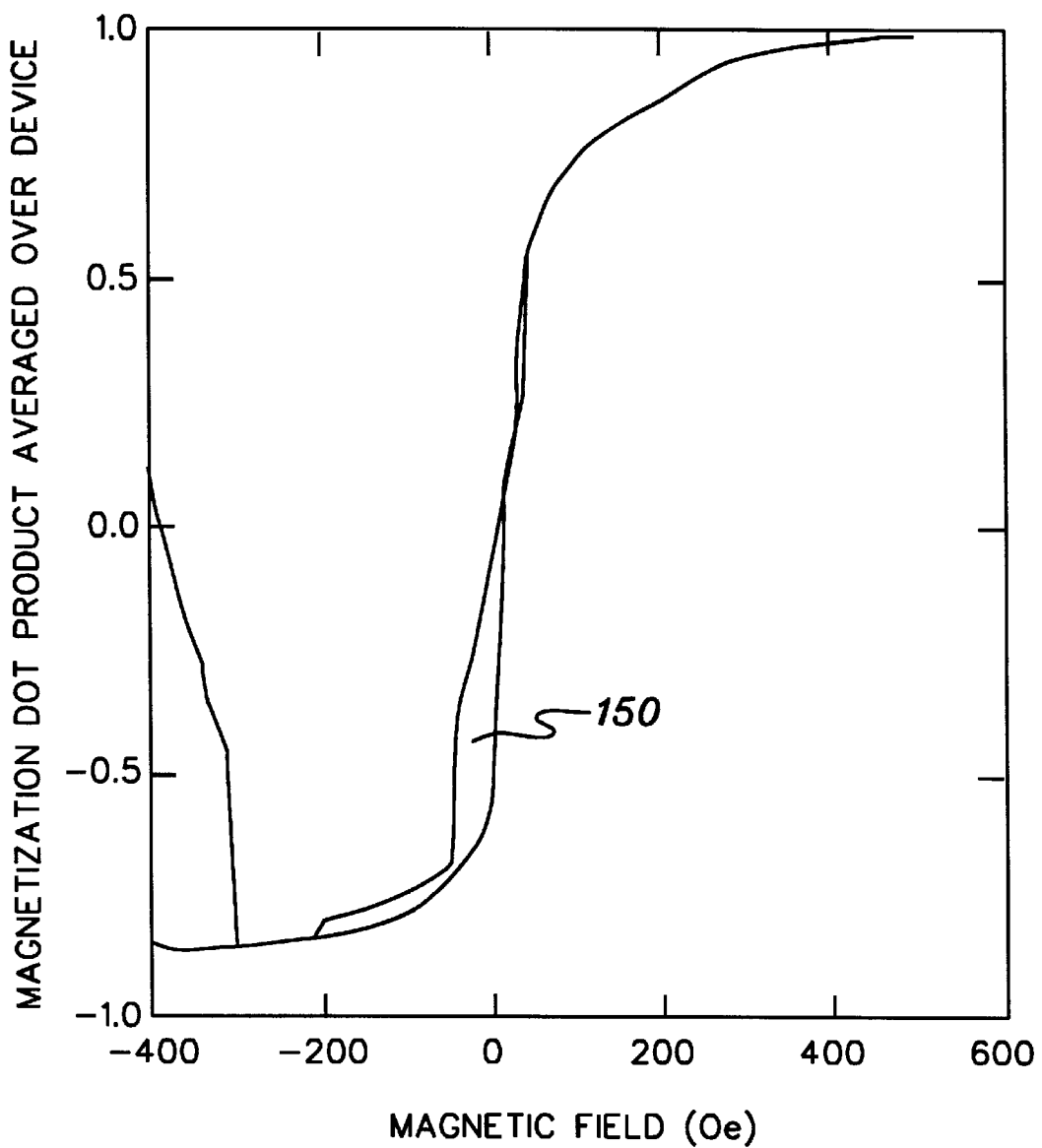
FIG. 4 is a calculated hysteresis loop of the sample region of FIG. 3.
Figure 5:
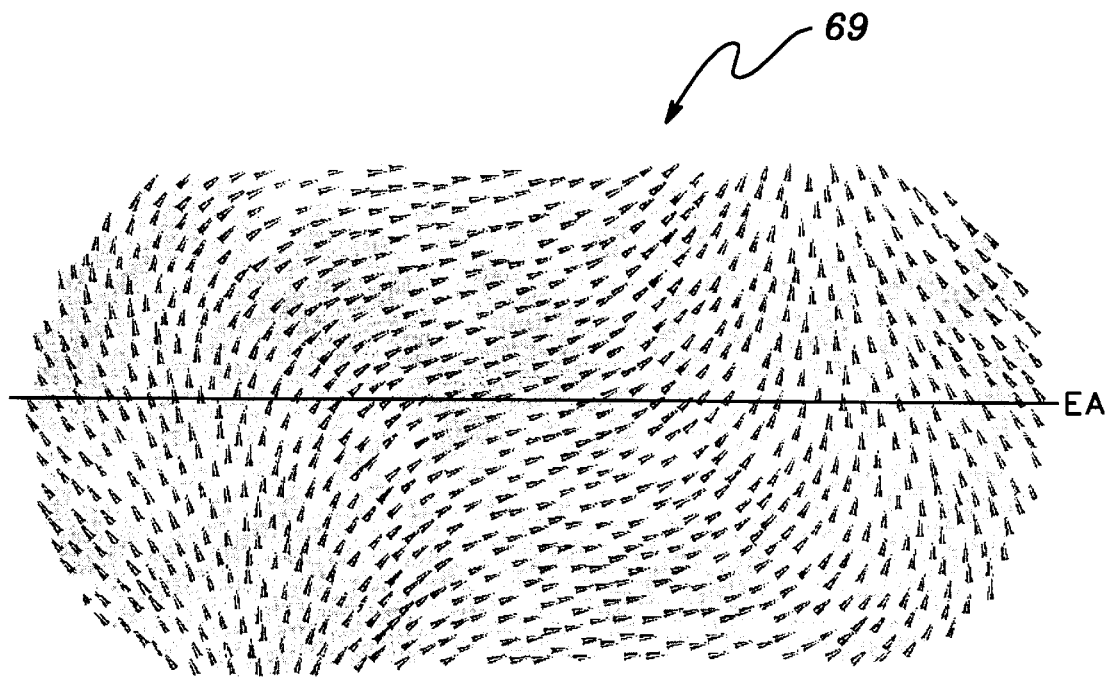
FIG. 5 depicts an improved magnetization pattern of a sample free region using techniques of a related U.S. Patent Application.
Figure 6:
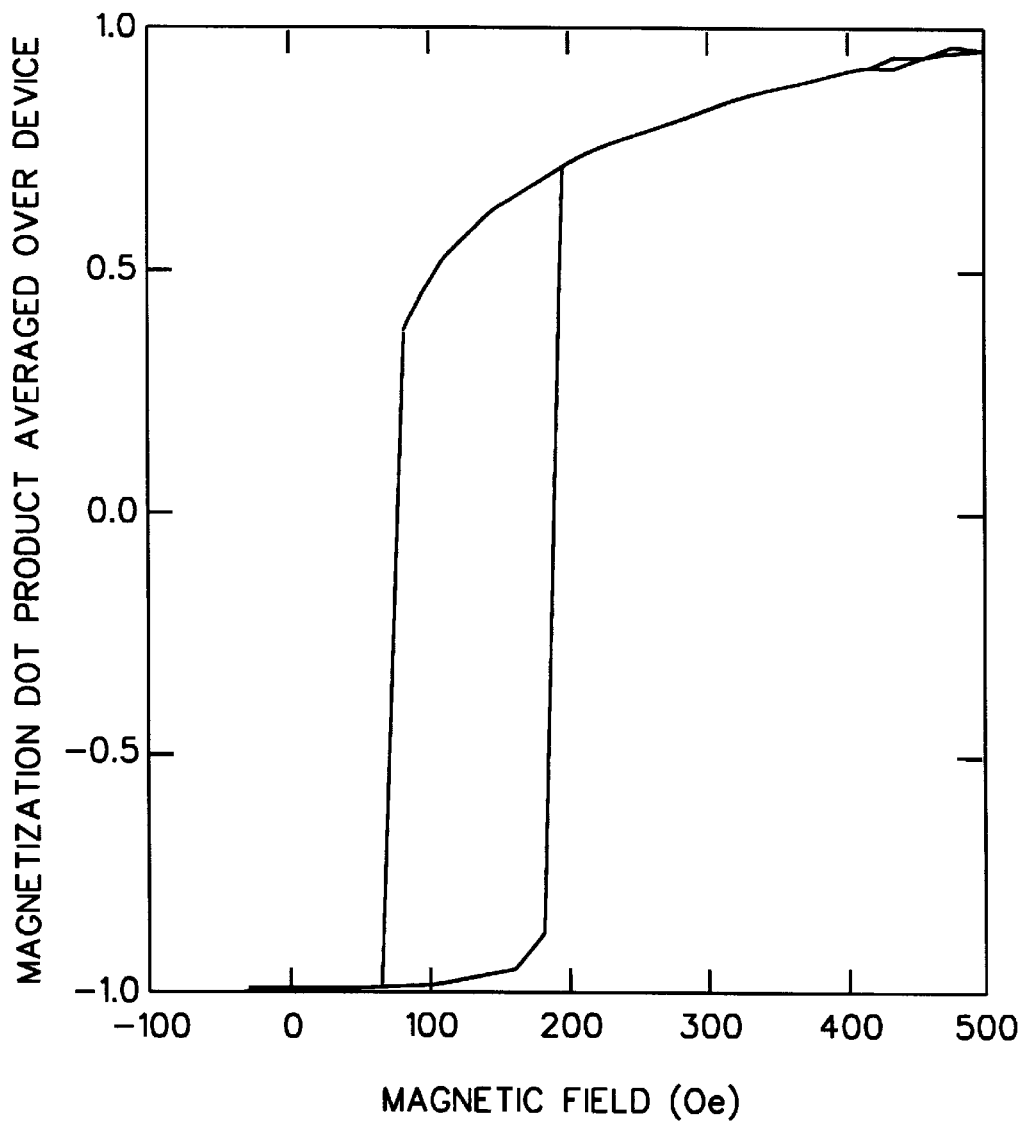
FIG. 6 is a measured hysteresis loop of the sample region of FIG. 5.

The principles of the present invention regarding the use and formation of magnetoresistive devices (e.g., magnetic tunnel junctions) in which electrical interaction only occurs through a preferred portion of the free magnetic region are discussed below with reference to FIGS. 7–13. However, by way of background, the general principles underlying the formation and operation of the magnetic memory array depicted in FIGS. 1a–b are first briefly discussed, in accordance with the above-incorporated U.S. Pat. Nos. 5,640,343 and 5,650,958.

With reference to FIG. 1a, an exemplary MRAM array includes a set of electrically conductive lines that function as parallel word lines 1, 2, and 3 in a horizontal plane, and a set of electrically conductive lines that function as parallel bit lines 4, 5, and 6 in another horizontal plane. The bit lines are oriented in a different direction, e.g., at right angles to the word lines, so that the two sets of lines intersect when viewed from above. A memory cell, such as typical memory cell 9 shown in detail in FIG. 1b, is located at each crossing point of the word lines and bit lines in the intersection region vertically spaced between the lines. Three word lines and three bit lines are illustrated in FIG. 1a, but the number of lines would typically be much larger. The memory cell 9 is arranged in a vertical stack and may include a diode 7 and a magnetic tunnel junction ("MTJ") 8. During operation of the array, current flows in a vertical direction through the cell 9. The vertical current path through the memory cell permits the memory cell to occupy a very small surface area. Contact to the word lines, the MTJ, the diode, and the contact to the bit line all occupy the same area. While not shown in FIG. 1a, the array may be formed on a substrate, such as a silicon substrate on which there would be other circuitry. Also, a layer of insulating material is usually located between the bit lines and word lines at regions of the MRAM other than the intersecting regions.

The structure of the memory cell 9 is described in more detail with reference to FIG. 1b. The memory cell 9 is formed on and in contact with a word line 3 (FIG. 1a). The memory cell 9 comprises a vertical stack of a diode-like device, e.g., silicon junction diode 7, and an MTJ 8 in electrical series connection. The diode 7 is a silicon junction diode that comprises an n-type silicon layer 10 and a p-type silicon layer 11. The diode's p-type silicon layer 11 is connected to the MTJ 8 via a tungsten stud 12. The diode's n-type silicon layer 10 is connected to word line 3.

The MTJ 8 may be formed of a series of layers of material stacked one on top of the other. The MTJ 8 of FIG. 1b comprises a template layer 15, such as Pt, an initial ferromagnetic layer 16, such as permalloy (Ni—Fe), an antiferromagnetic layer (AF) 18, such as Mn—Fe, a fixed or "pinned" type of reference ferromagnetic layer (FMF) 20, such as Co, Fe or permalloy, a thin tunneling barrier layer 22 of alumina ($Al_2O_3$), a soft, changeable "free" ferromagnetic layer (FMS) 24, such as a sandwich of thin Co—Fe with permalloy, and a contact layer 25, such as Pt.

The free layer is fabricated to have a preferred axis for the direction of magnetization called the easy axis ("EA"). There are two possible directions of magnetization of the free layer along this easy axis which define the two states of the memory cell. In contrast, the reference layer may be fabricated to have only one preferred direction of magnetization, called its unidirectional anisotropy direction, and this direction is parallel to the easy axis of the free layer. The desired easy axis for the free layer is set by some combination of intrinsic anisotropy, strain-induced anisotropy and shape anisotropy of the MTJ. The MTJ and free layer depicted may be made in the shape of a rectangle of length L and width W, where L is larger than W (FIG. 1b). The magnetic moment of the free layer prefers to align along the direction of L.

The unidirectional anisotropy direction of the reference layer is set by growing the Fe—Mn AF layer 18 on the initial ferromagnetic layer 16, which is itself grown on the template layer 15, such as Pt or Cu or Ta. The template layer 15 induces a 111 crystallographic texture in the initial ferromagnetic layer 16. These layers are deposited in a magnetic field directed parallel to the desired easy axis of the free layer, creating the desired intrinsic unidirectional anisotropy direction of the reference layer. Alternatively, the AF layer can be deposited on the template layer in a sufficiently large magnetic field parallel to the said easy axis while heating the substrate to a temperature higher than the blocking temperature of the AF material. In this alternative, the initial ferromagnetic layer 16 is not required. It is also possible to take advantage of the magnetostriction of the fixed layer to develop, during processing, a magnetic anisotropy which aligns magnetization along the applied magnetic field direction during deposition.

Because of exchange coupling between the reference and AF layers, the magnetization direction of the reference layer is more difficult to change than that of the free layer. In the range of fields applied by currents through the bit and word lines, the magnetization direction of the reference layer is fixed or pinned, in this embodiment. Shape anisotropy of the reference layer, which follows the shape anisotropy of the MTJ, provides additional stability of the magnetization direction of the fixed layer. The magnetic fields applied to write the memory cell are large enough to reverse the direction of magnetization of the free layer, but not the direction of the reference layer. Thus, the magnetization of the fixed layer does not change direction during operation of the memory cells in the MRAM.

During array operation, when a sufficiently large current is passed through both a write line and a bit line of the MRAM, the self-field of the combined current at the intersection of the write and bit lines will rotate the magnetization of the free layer of the single particular MTJ located at the intersection of the energized write and bit lines. The current levels are designed so that the combined self-field exceeds the switching field of the free layer. This self-field is designed to be much smaller than the field required to rotate the magnetization of the reference layer. The cell array architecture is designed so that the write currents do not pass through the MTJ itself. The memory cell is read by passing a sense current perpendicularly through the diode and MTJ from the reference layer through the tunnel junction barrier to the free layer (or vice versa). Since the resistance of the $Al_2O_3$ tunnel barrier is strongly dependent on the thickness of the $Al_2O_3$ layer, approximately varying exponentially with the thickness of this layer, this means that the electrical current largely flows perpendicularly through the $Al_2O_3$ tunnel barrier. The probability of a charge carrier tunneling across the barrier falls off strongly with increasing $Al_2O_3$ thickness so the only carriers that tunnel across the junction are those which traverse perpendicular to the junction layer. The state of the memory cell is determined by measuring the resistance of the memory cell when a sense current, much smaller than the write currents, is passed perpendicularly through the MTJ. The self-field of this sense or read current is negligible and does not affect the magnetic state of the memory cell. The probability of tunneling of charge carriers across the tunnel barrier depends on the relative alignment of the magnetic moments of the free and the reference layers. The tunneling current is spin polarized, which means that the electrical current passing from one of the ferromagnetic layers, for example, the fixed layer, is predominantly composed of electrons of one spin type (spin up or spin down, depending on the orientation of the magnetization of the ferromagnetic layer). The degree of spin polarization of the current is determined by the electronic band structure of the magnetic material comprising the ferromagnetic layer at the interface of the ferromagnetic layer with the tunnel barrier. The first ferromagnetic layer tunnel barrier thus acts as a spin filter. The probability of tunneling of the charge carriers depends on the availability of electronic states of the same spin polarization as the spin polarization of the electrical current in the second it ferromagnetic layer. Usually, when the magnetic moment of the second ferromagnetic layer is aligned to the magnetic moment of the first ferromagnetic layer, there are more available electronic states than when the magnetic moment of the second ferromagnetic layer is aligned anti-aligned to that of the first ferromagnetic layer. Thus, the tunneling probability of the charge carriers is highest when the magnetic moments of both layers are aligned, and is lowest when the magnetic moments are anti-aligned. When the moments are arranged, neither aligned nor anti-aligned, the tunneling probability takes an intermediate value. Thus, the electrical resistance of the cell depends on both the spin polarization of the electrical current and the electronic states in both of the ferromagnetic layers. As a result, the two possible magnetization directions of the free layer uniquely define two possible bit states (0 or 1) of the memory cell.

Figure 7:
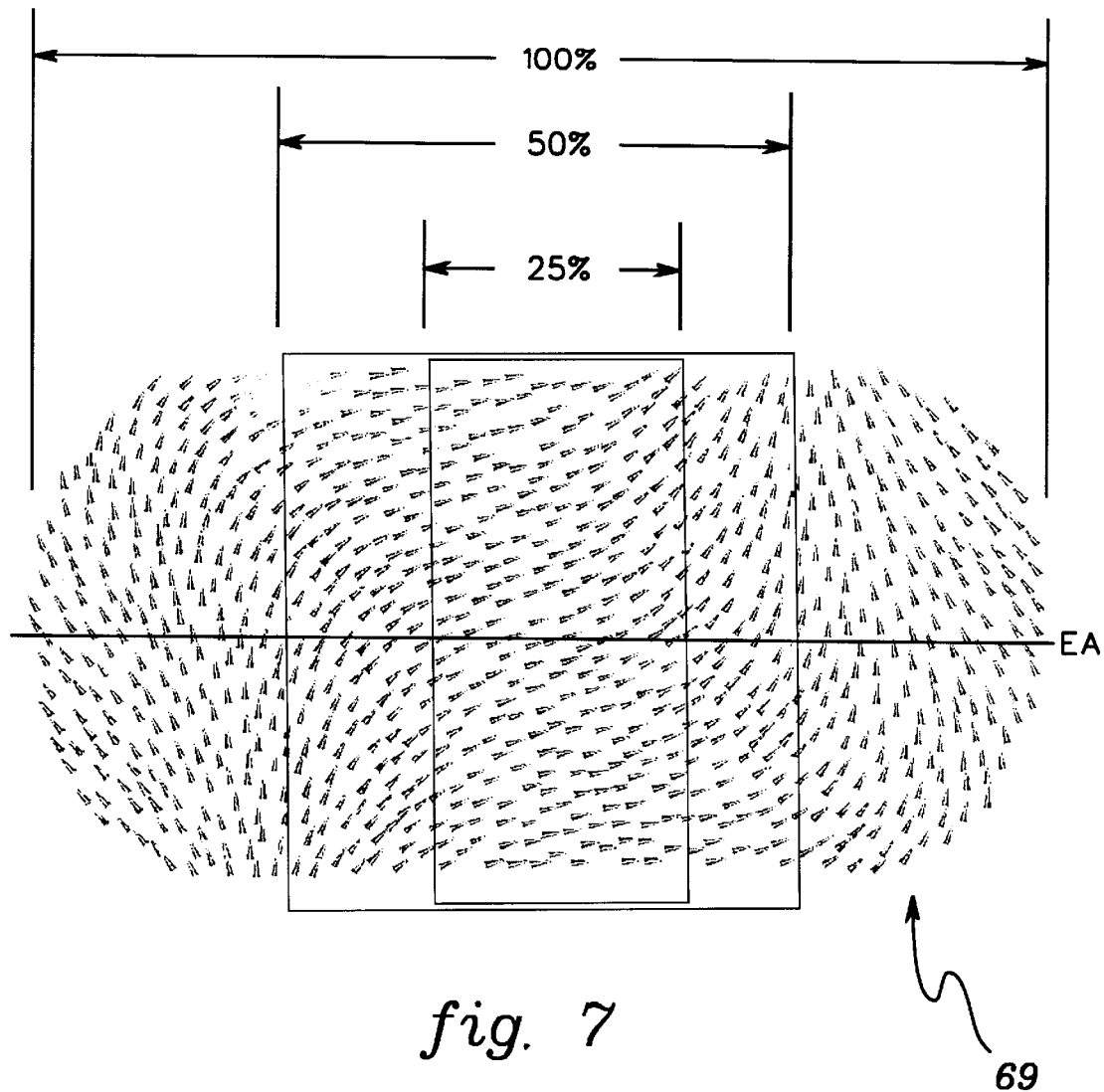
FIG. 7 again depicts the magnetization pattern of the free region of FIG. 5, having super-imposed thereon indicia representing smaller preferred portions where the two possible directions of magnetization can be dependably predicted to be substantially uniform and opposite of one another.

In accordance with the present invention, and with reference to FIG. 7, exemplary preferred portions of the free magnetic region of a cell 69 are identified and shown as 25% and 50% of the size of the entire (100%) free region measured along its easy axis. These preferred regions may be centered at the midpoint of the easy axis, as shown. As the magnetization starts to reverse, the magnetization patterns in the outer edges of the free region start to curl up or down. However, in the preferred, middle region of the free region shown, the magnetization pattern remains substantially parallel to the easy axis. Therefore, in accordance with the present invention, techniques are disclosed to limit electrical interaction (e.g, tunneling) through only a preferred portion of the free magnetic region, e.g., the portion in which the magnetization pattern can be dependably predicted to assume one of two uniform, substantially opposing states, substantially parallel to the easy axis.

Figure 8:
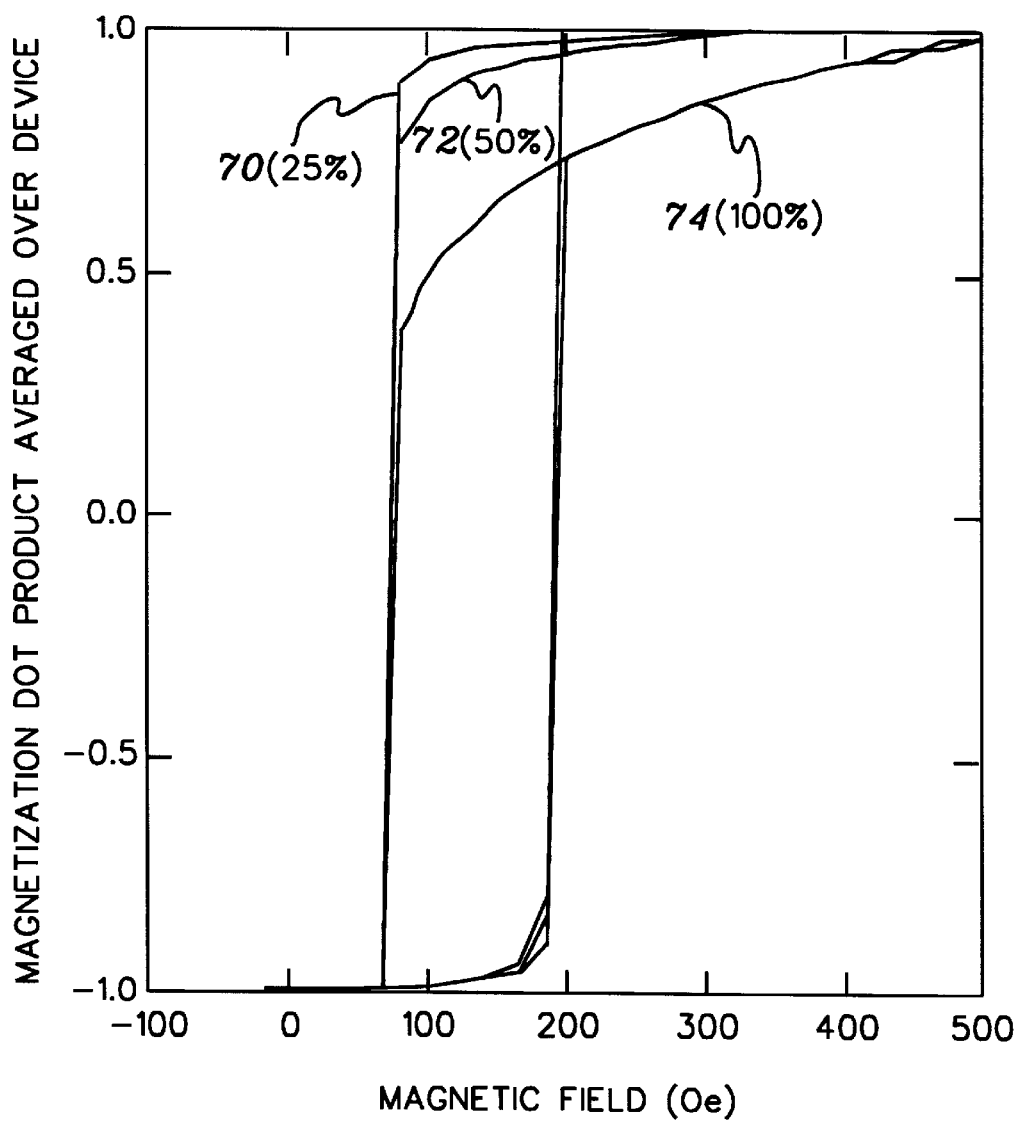
FIG. 8 shows three measured hysteresis loops of the super-imposed regions represented in FIG. 7, respectively.

The three measured hysteresis loops for electrical tunneling through the respective regions of FIG. 7 are shown in FIG. 8. As the tunneling is limited from 100% (curve 74) to 50% (curve 72) and finally to 25% (curve 70), the hysteresis loops become more square, and the regions of interest become more separated from each other. This behavior is desirable for compatibility with standard chip design techniques, in which tolerances for operation must be maintained.

Figure 9:
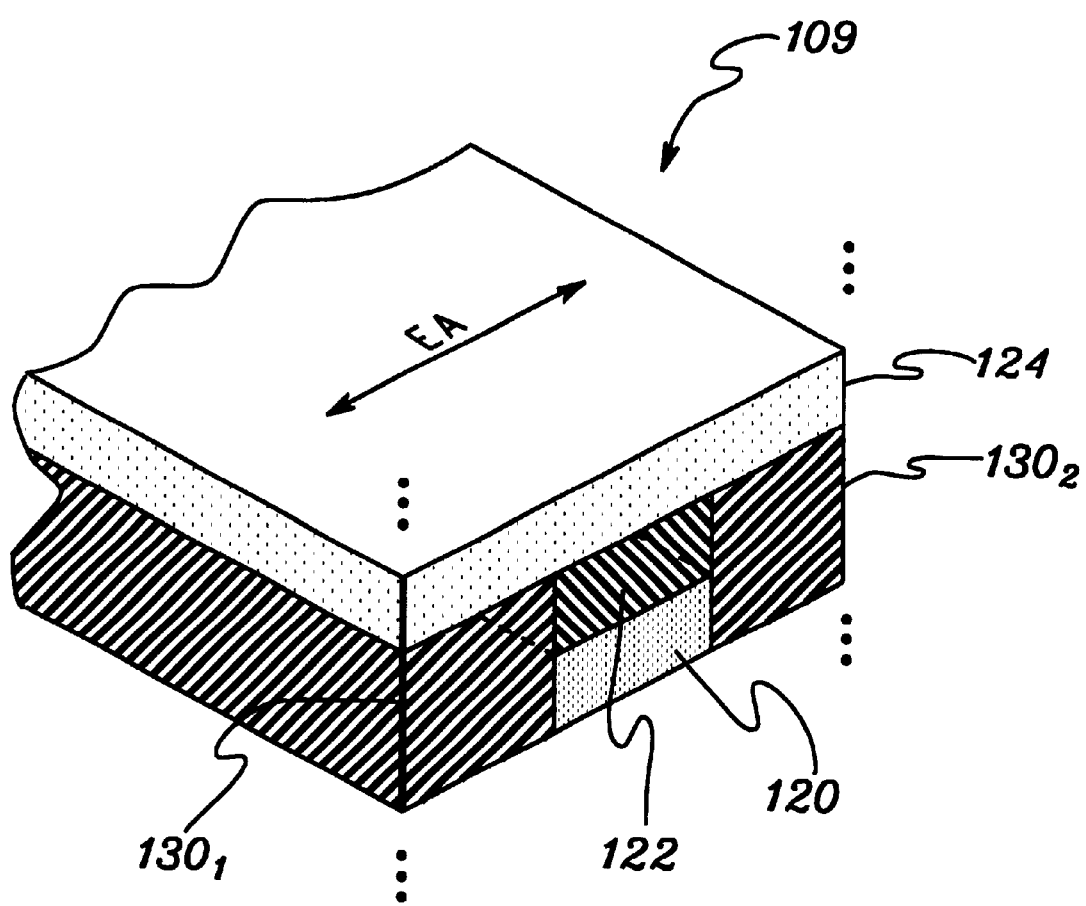
FIG. 9 is an exemplary embodiment of a magnetic tunnel junction device formed in accordance with the present invention wherein the electrical tunneling is limited to a preferred portion of the free magnetic region by using a smaller tunneling region, and insulation, positioned proximate thereto.

With reference to FIG. 9, exemplary magnetic tunnel junction device 109 is shown in which tunneling is limited to a preferred portion of free magnetic region 124 by using a smaller tunneling region 122. Reference magnetic region 120 may be the same size as the tunneling region. Any particular structure used to limit electrical interaction to a preferred portion of free region 124 is contemplated by the present invention. To prevent interaction in the regions outside of the preferred portion of free region 124, insulating regions $130_1$ and $130_2$ can be used (adjacent the tunneling region 122 and the reference region 120) which prevent electrical tunneling through the remaining portions of layer 124 outside of the preferred portion thereof. Though FIG. 9 shows limiting tunneling in the direction parallel to the easy axis, tunneling can be similarly limited along any arbitrary axes of the free region to thereby limit tunneling to any arbitrarily located, but preferred, portion of the free region.

FIGS. 10–13 represent alternative techniques for fabricating the structures required to limit the electrical tunneling through only the preferred portion of the free magnetic region, in accordance with the present invention. It will be understood by those skilled in the art that other regions of the magnetic tunnel junction device (e.g., diode 7) can be formed, without departing from the present invention. Such regions are omitted from FIGS. 10–13 for clarity. (Throughout these figures the prime "'" designation is used to denote regions as they exist prior to the completion of the process.)

Figure 10A:
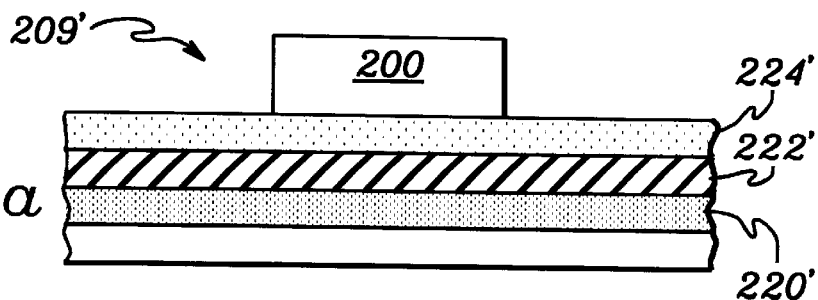
FIGS. 10a–e depict a first fabrication process for forming a magnetic tunnel junction device in accordance with the principles of the present invention.
Figure 10B:
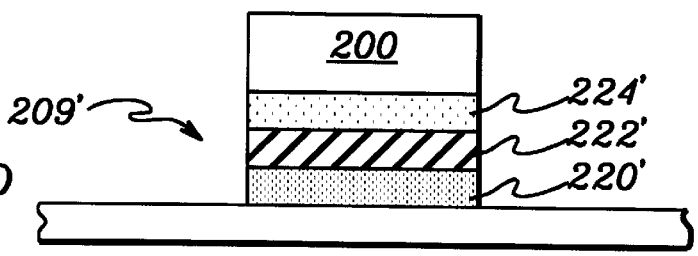
Figure 10C:
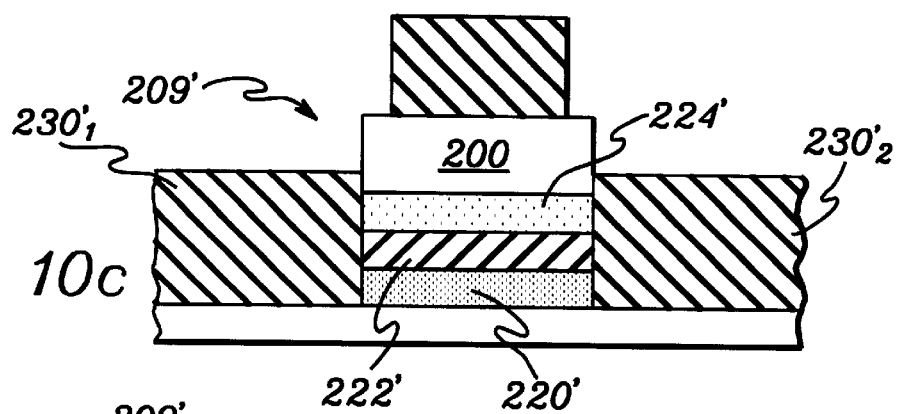
Figure 10D:
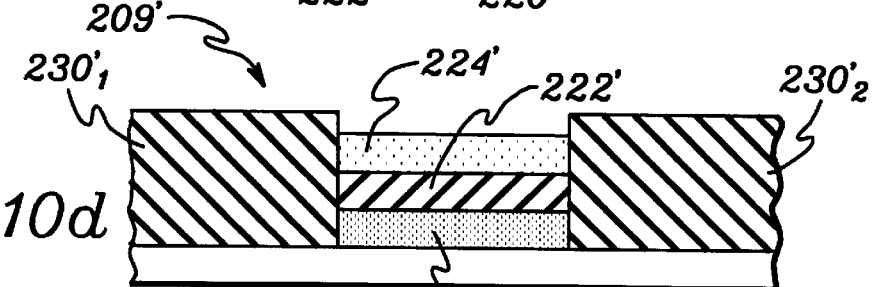
Figure 10E:
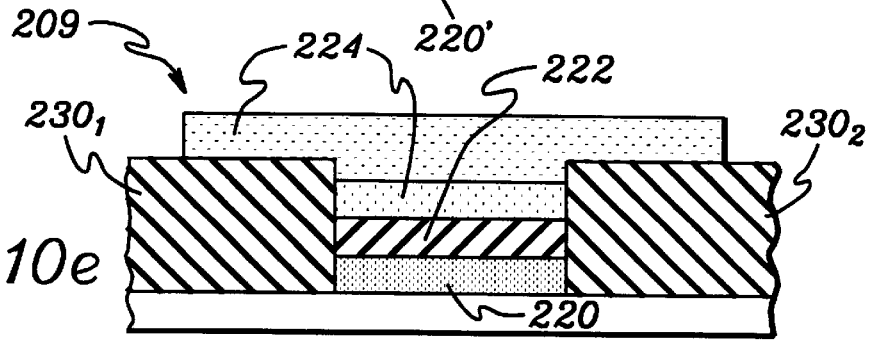

A first fabrication embodiment is depicted in FIGS. 10a–e for forming magnetic tunnel junction device 209. With reference to FIG. 10a, reference magnetic region 220' (e.g., MnFe, NiFe, or any suitable magnetic material), tunneling region 222' (e.g., Al, $Al_2O_3$, fully or partially oxidized Al, or $SiO_2$), and free region 224' (e.g., NiFe or any suitable magnetic material) are first deposited, over which a mask 200 (suitable photoresist material) is placed. Areas of those three regions are shown removed by, for example, etching, in FIG. 10b, wherein regions under the mask 200 are shown preserved. In FIG. 10c, an overlying layer of insulation is formed, forming adjacent regions $230_1'$ and $230_2'$. FIG. 10d shows the resultant structure following the removal of mask 200, and its overlying insulation. Layers 220', 222' and 224' are now surrounded by insulating regions $230_1'$ and $230_2'$ (e.g., $Al_2O_3$ or $SiO_2$). A final layer of free magnetic material is then deposited over and beyond the formed stack, thereby resulting in a larger, combined magnetically free region 224, as shown in FIG. 10e. Tunneling through combined free region 224 is therefore limited to an exemplary middle, preferred portion thereof, according to the smaller tunneling region 222, and the now underlying insulating regions $230_1$ and $230_2$.

Figure 11A:
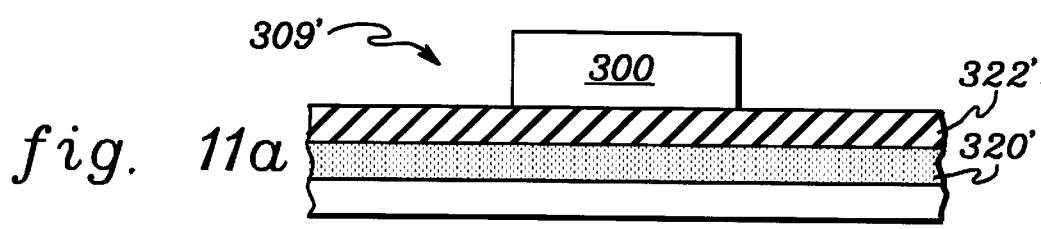
FIGS. 11a–e depict a second fabrication process for forming a magnetic tunnel junction device in accordance with the principles of the present invention.
Figure 11B:
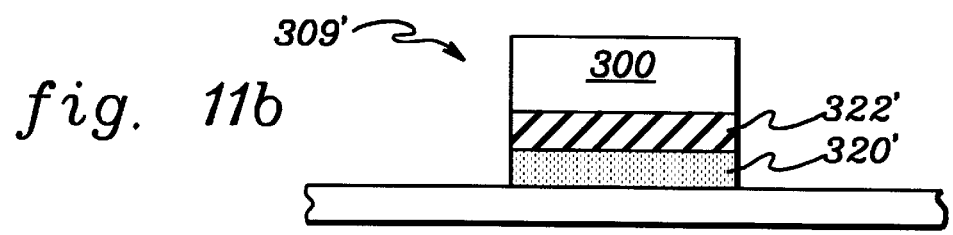
Figure 11C:
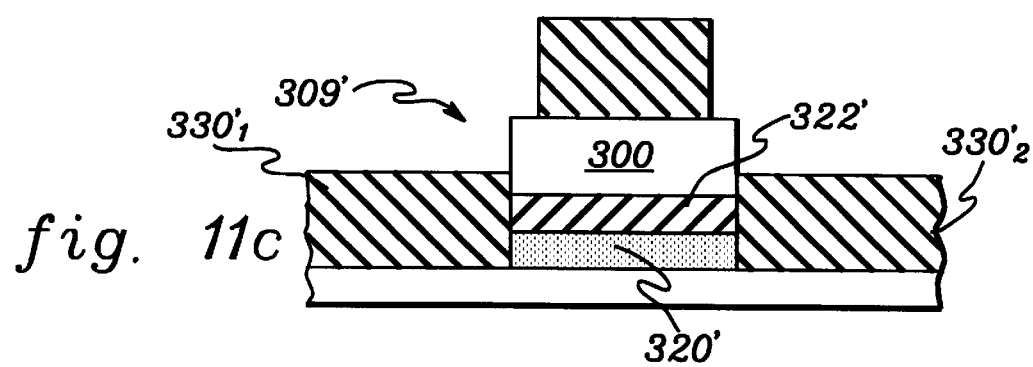
Figure 11D:
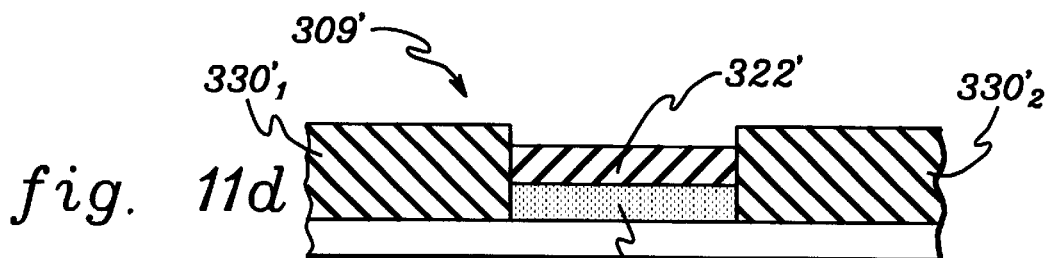
Figure 11E:
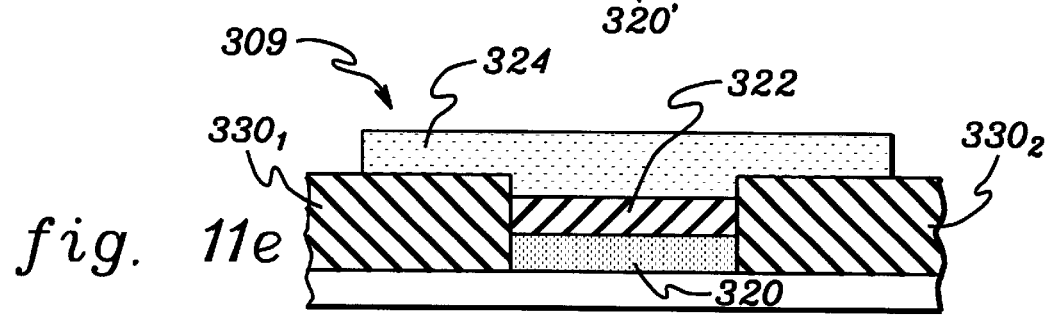

A second fabrication embodiment is depicted in FIGS. 11a–e for forming magnetic tunnel junction device 309. In FIG. 11a, reference magnetic region 320' is deposited, over which a tunneling layer 322' is deposited, over which mask 300 is placed. In FIG. 11b, the stack of regions 320', 322' and 300 is defined by using, for example, etching around mask 300. In FIG. 11c, an insulation layer is deposited over the structure forming insulating regions $330_1'$ and $330_2'$, which surround the stack of layers 320' and 322'. In FIG. 11d, upon removal of the mask 300 and its overlying insulation, tunneling region 322' remains over a magnetically reference region 320', both surrounded by insulating regions $330_1'$ and $330_2'$. Finally, in FIG. 11e, a free magnetic layer 324 is deposited over the structure, and extends beyond the edges of the stack defined by reference region 320' and tunneling region 322', resulting in tunnel junction device 309, wherein the tunneling occurs only through the middle, preferred portion of free magnetic layer 324. Tunneling is prevented outside of the middle, preferred region by insulation regions $330_1$ and $330_2$.

Figure 12A:
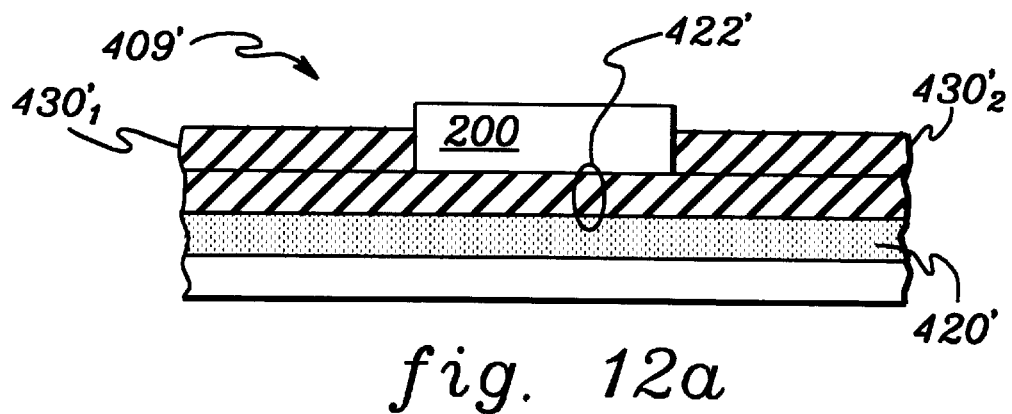
FIGS. 12a–c depict a third fabrication process for forming a magnetic tunnel junction device in accordance with the principles of the present invention.
Figure 12B:
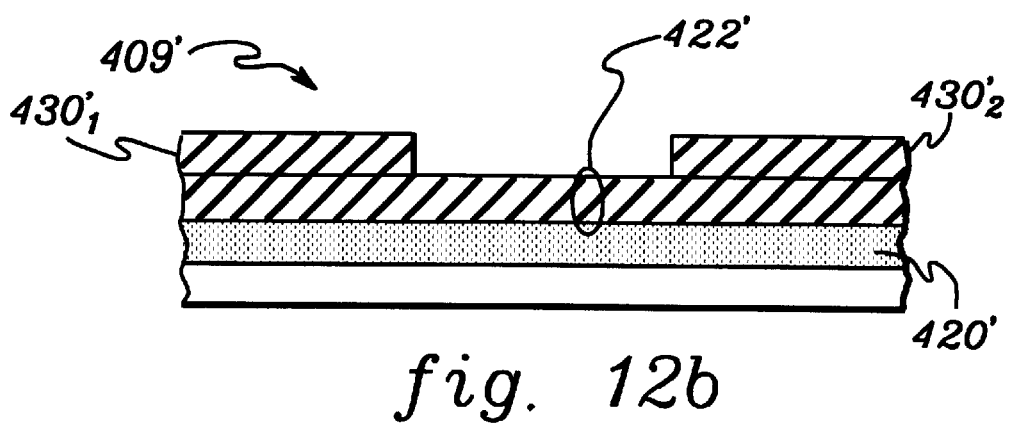
Figure 12C:
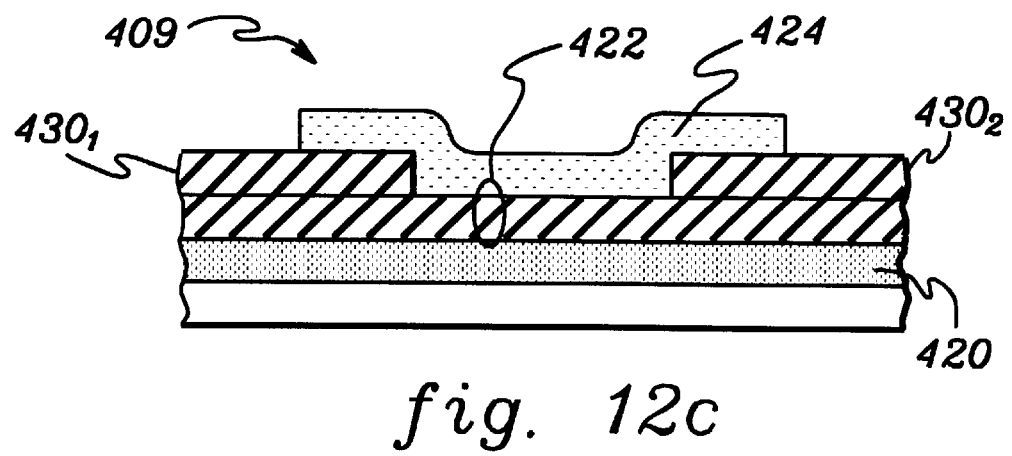

A third fabrication embodiment is depicted in FIGS. 12a–c for forming magnetic tunnel junction device 409. In FIG. 12a, magnetic reference region 420' is deposited, followed by deposition of a tunneling layer comprising tunneling region 422', and an insulating layer, interrupted by mask 200, forming adjacent insulating regions $430_1'$ and $430_2'$. The material forming region 422', as well as regions $430_1'$ and $430_2'$ comprise the same insulating material, however, the thinned middle, preferred tunneling region designated 422' results in greater electrical conduction in that region. In FIG. 12b, mask 200 is removed, and in its place, in FIG. 12c, magnetically free region 424 is deposited beyond the thinned tunneling region 422, such that tunneling only occurs through a middle, preferred portion of magnetically free region 424, and tunneling is prevented outside of this middle, preferred region by the thicker insulating regions $430_1$ and $430_2$.

Figure 13A:
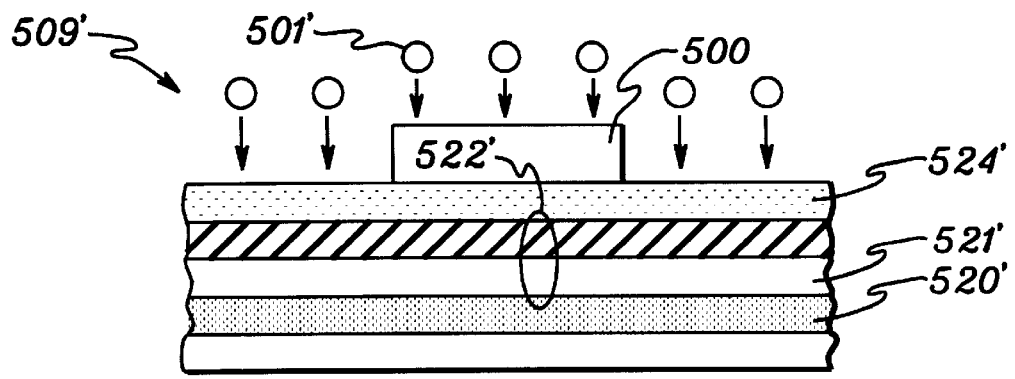
FIGS. 13a–c depict a fourth fabrication process for forming a magnetic tunnel junction device in accordance with the principles of the present invention.
Figure 13B:
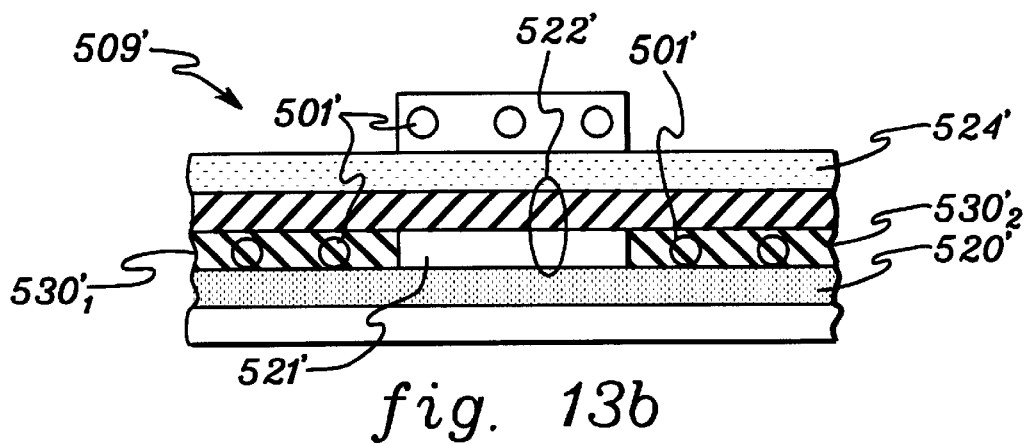
Figure 13C:
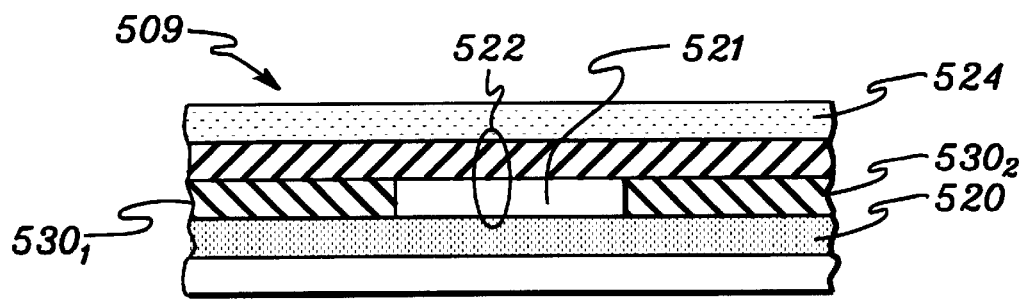

A fourth fabrication embodiment is depicted in FIGS. 13a–c for forming magnetic tunnel junction device 509. In FIG. 13a, magnetic reference region 520' is deposited, over which conductive layer 521' is deposited, formed from, for example, aluminum (Al). Another insulating layer to form tunneling region 522' is then deposited (or alternatively the Al is only partially oxidized to form the tunneling region 522'), over which the magnetically free region 524' is deposited. A protective mask 500 is defined over the structure. Oxygen ions ($O_2$) 501' are then ion-implanted into the structure, and an anneal step results in regions $530_1'$ and $530_2'$, formerly aluminum, being converted to insulating $Al_2O_3$ regions. However, mask 500 absorbs the ions and prevents the conversion of the smaller region 521 of the aluminum layer into an insulating layer in tunneling region 522'. In FIG. 13c, following mask removal, magnetic tunnel junction device 509 results having a tunneling region 522' proximate the middle, preferred portion of free layer 524, and thicker, insulating regions $530_1$ and $530_2$ outside of this preferred portion. Therefore, electrical tunneling only occurs through the middle, preferred portion of free region 524, as determined by this structure of mixed conductive/insulating regions.

Described herein is an additive process which increases the insulating characteristics on the sides of the preferred tunneling region. A subtractive approach is also possible in which the electrical conductivity is increased at the preferred portion of the tunnel junction by implantation or irradiation.

The masks discussed above could serve dual purposes, i.e., they could also be part of a bitline so that a self-masking structure is realized.

The present invention is discussed above primarily in connection with magnetic tunnel junction ("MTJ") devices. However, the principles of the present invention extend to any type of magnetoresistive device, for example, giant magnetoresistive ("GMR") devices in which current scattering effects are used to access the device. Limiting the current interaction to preferred areas of the magnetic regions in these devices will similarly improve the overall response of the device.

Although the invention is disclosed herein primarily in connection with MRAM, the improvements disclosed herein are also applicable to other devices that could be made from magnetoresistive devices. In particular, these improvements could be applied to magnetic devices in general, including logic devices and sensors such as magnetic recording heads.

Figure 14:
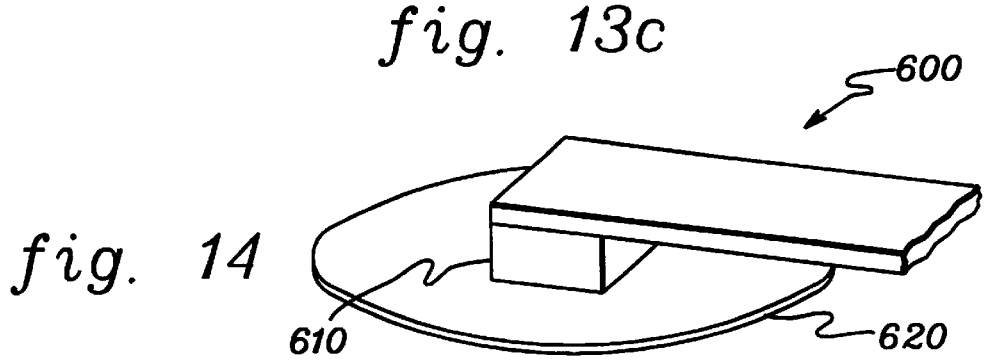
FIG. 14 depicts an embodiment of the present invention wherein the magnetoresistive element disclosed herein is used in a magnetic storage device.

In that regard, the present invention is applicable to sensors in general, e.g., magnetoresistive access elements mounted on disk drive heads, as shown in FIG. 14 wherein an access element 610 is mounted in relation to a storage medium 620 in a magnetic storage device 600. In disk drives, the magnetization patterns of the access element are varied according to magnetic fields caused by an underlying magnetic data storage moving relative to the access element. The resultant magnetization in the access element is then electrically sensed to determine the relative orientation of the magnetization in the access element. Sensors often have a reduced sensitivity because of the edges of the magnetic regions where the magnetization tends to be locked in a direction parallel to the edge. These areas shunt current away from the active part of the sensors and reduce its sensitivity. In accordance with the principles of the present invention, using only preferred portions of the magnetically changeable region in the access element for electrical tunneling will improve the overall electrical and magnetic response of these access elements.

The principles of the present invention can be used alone, or in combination with others disclosed in the above-identified, co-filed U.S. Patent Applications. For example, by restricting the magnetic writing stimulus to a preferred portion of the changeable magnetic region, the magnetization reversal process can be improved. Limiting the magnetic writing stimulus to a preferred portion of the changeable region can be accomplished in accordance with the principles of the above-incorporated U.S. Patent Application entitled "LIMITING MAGNETIC WRITING FIELDS TO A PREFERRED PORTION OF A CHANGEABLE MAGNETIC REGION IN MAGNETIC DEVICES."

In addition, arrays of multiple junctions (e.g., arranged in parallel), as well as the other multiple junction approaches can be employed as disclosed in the above-incorporated U.S. Patent Application entitled "MAGNETIC MEMORY DEVICES HAVING MULTIPLE MAGNETIC TUNNEL JUNCTIONS THEREIN."

Asymmetric cell arrangement and stimulus approaches can also be used such as those disclosed in the above-incorporated U.S. Patent Application entitled "INTENTIONAL ASYMMETRY IMPOSED DURING FABRICATION AND/OR ACCESS OF MAGNETIC TUNNEL JUNCTION DEVICES."

The present invention provides an improvement in the electrical performance of even the most well-behaved magnetoresistive devices, since even in such well-behaved devices, the magnetically free regions may not uniformly assume a single one of two possible directions of magnetization. By limiting electrical interaction only to preferred portions of the magnetically free regions, e.g., the portions within which the magnetization can be dependably predicted to uniformly assume one of two substantially opposing directions, the performance of the device is improved.

While the invention has been particularly shown and described with reference to preferred embodiment(s) thereof, it will be understood by those skilled in the art that various changes in form and details may be made therein without departing from the spirit and scope of the invention.

What is claimed is:

1. A magnetoresistive device, comprising:
a first magnetic region, and a second magnetic region separated from a preferred portion thereof by a non-ferromagnetic layer, formed in conjunction with at least one other structure in said device, such that upon magnetoresistive electrical interaction therewith caused by a primarily perpendicular application of current through said device with electrodes, said interaction occurs only through the preferred portion of said first magnetic region.

2. The magnetoresistive device of claim 1, in combination with a magnetic data storage medium, the magnetoresistive device comprising a magnetic access element adapted to access data on said magnetic data storage medium.

3. A magnetoresistive device, comprising:
a first magnetic region, and a second magnetic region separated from a preferred portion thereof by a non-ferromagnetic layer, formed in conjunction with at least one other structure in said device, such that upon magnetoresistive electrical interaction therewith caused by a primarily perpendicular application of current through said device with electrodes, said interaction occurs only through the preferred portion of said first magnetic region, wherein said first magnetic region and said second magnetic region are substantially laterally coextensive, and wherein said preferred portion comprises a single preferred portion.

4. A magnetoresistive device of claim 3, wherein:
the first magnetic region is changeable into one of at least two substantially opposing magnetic states along an axis thereof, and wherein said preferred portion of said first magnetic region is centered about a midpoint of said axis.

5. The magnetoresistive device of claim 4, wherein said preferred portion of said first magnetic region is less than about 50% of the size of said first magnetic region measured in a first lateral dimension parallel to said axis.

6. The magnetoresistive device of claim 3, wherein said at least one other structure in said device comprises an electrical interaction region smaller than said first magnetic region and arranged in a conductive relationship to said preferred portion of said first magnetic region thereby effecting said interaction only through said preferred portion of said first magnetic region, and not any remaining portion thereof.

7. The magnetoresistive device of claim 3, wherein said at least one other structure in said device comprises an electrically insulating region arranged in an insulating relationship to the remaining portion of the first magnetic region but not the preferred portion thereof, thereby effecting said interaction only through said preferred portion of said first magnetic region and not any remaining portion thereof.

8. The magnetoresistive device of claim 3, wherein:
said preferred portion of said first magnetic region comprises a region wherein each of two magnetic states into which the first magnetic region is changeable can be dependably predicted to be substantially uniform and opposite of one another.

9. A magnetoresistive device, comprising:
a first magnetic region, and a second magnetic region separated therefrom by a non-ferromagnetic layer, formed in conjunction with at least one other structure in said device, such that upon magnetoresistive electrical interaction therewith caused by a primarily perpendicular application of current through said device, said interaction occurs only through a preferred portion of said first magnetic region, wherein said preferred portion is about 25% of the size of said first magnetic region measured in said first lateral dimension parallel to said axis.

10. A magnetoresistive device in combination with a magnetic memory, the magnetoresistive device comprising:
a first magnetic region formed in conjunction with at least one other structure in said device, such that upon magnetoresistive electrical interaction therewith, said interaction occurs only through a preferred portion of said first magnetic region, the magnetoresistive device comprising a magnetic memory cell in said magnetic memory, the magnetic memory comprising:
first and second pluralities of crossing conductive lines forming a plurality of intersecting regions; and
a plurality of magnetic memory cells, including said magnetic memory cell, each disposed at a respective one of the plurality of intersecting regions and being accessed by the respective crossing lines forming its respective intersecting region.

11. A magnetoresistive device, comprising:
a first magnetic region formed in conjunction with at least one other structure in said device, such that upon magnetoresistive electrical interaction therewith caused by electrodes, said interaction occurs only through a preferred portion of said first magnetic region, wherein said magnetoresistive device comprises a magnetic tunnel junction device and wherein said magnetoresistive electrical interaction comprises electrical tunneling.

12. A magnetoresistive device, comprising:

a first planar magnetic layer changeable into each of two magnetic states;

a second planar magnetic layer separated from a preferred portion of the first layer by a non-ferromagnetic layer;

an electrical interaction region smaller in lateral size than said first planar magnetic layer and positioned with respect to said first planar magnetic layer to effect magnetoresistive electrical interaction, caused by a primarily perpendicular application of current though said device with electrodes, only through the preferred portion of said first planar magnetic layer; and wherein said first magnetic region and said second magnetic region are substantially laterally coextensive, and wherein said preferred portion comprises a single preferred portion.

13. The magnetoresistive device of claim 12, wherein:

said electrical interaction region is less than about 50% of the size of said first planar magnetic layer measured in a first lateral dimension parallel to the plane within which said first planar magnetic layer is formed.

14. The magnetoresistive device of claim 12, further comprising:

electrically insulting material positioned to prevent said electrical interaction through said remaining portion of said first magnetic layer.

15. The magnetoresistive device of claim 12, in combination with a magnetic data storage medium, the magnetoresistive device comprising a magnetic access element adapted to access data on said magnetic data storage medium.

16. The magnetoresistive device of claim 12, wherein:

said preferred portion of said first planar magnetic layer comprises a region wherein each of the two net magnetic states can be dependably predicted to be substantially uniform and opposite of one another.

17. A magnetoresistive device, comprising:

a first planar magnetic layer changeable into each of two magnetic states;

a second planar magnetic layer separated therefrom by a non-ferromagnetic layer; and an electrical interaction region smaller in lateral size than said first planar magnetic layer and positioned with respect to said first planar magnetic layer to effect magnetoresistive electrical interaction, caused by a primarily perpendicular application of current though said device using electrodes, only through a preferred portion of said first planar magnetic layer, wherein:

said electrical interaction area is about 25% of the size of said first planar magnetic layer measured in said first lateral dimension parallel to the plane within which said first planar magnetic layer is formed.

18. A magnetoresistive device in combination with a magnetic memory, the magnetoresistive device comprising:

a first magnetic layer changeable into each of two magnetic states, and a second magnetic layer separated from said first magnetic layer by a non-ferromagnetic layer, wherein said first magnetic region and said second magnetic region are substantially laterally coextensive; and an electrical interaction region smaller in lateral size than said first magnetic layer and positioned with respect to said first magnetic layer to effect magnetoresistive electrical interaction only though a preferred portion of said first magnetic layer, said preferred portion comprising a single preferred portion, the magnetoresistive device comprising a magnetic memory cell in said magnetic memory, the magnetic memory comprising:

first and second pluralities of crossing conductive lines forming a plurality of intersecting regions; and a plurality of magnetic memory cells, including said magnetic memory cell, each disposed at a respective one of the plurality of intersecting regions and being accessed by the respective crossing lines forming its respective intersecting region.

19. A magnetoresistive device, comprising:

a first magnetic layer changeable into each of two magnetic states, and a second magnetic layer separated from said first magnetic layer by a non-ferromagnetic layer, wherein said first magnetic region and said second magnetic region are substantially laterally coextensive; and an electrical interaction region smaller in lateral size than said first magnetic layer and positioned with respect to said first magnetic layer to effect magnetoresistive electrical interaction only though a preferred portion of said first magnetic layer, said preferred portion comprising a single preferred portion, wherein said magnetoresistive device comprises a magnetic tunnel junction device and wherein said magnetoresistive electrical interaction comprises electrical tunneling caused by electrodes.

20. A method for accessing a magnetoresistive device having a first magnetic region changeable between at least two magnetic states, and a second magnetic region separated from a preferred portion of the first magnetic region by the non-ferromagnetic layer, wherein said first magnetic region and said second magnetic region are substantially laterally coextensive, comprising:

limiting magnetoresistive electrical interaction, caused by a primarily perpendicular application of current though said device using electrodes, to a single preferred portion of said first magnetic region.

21. The method of claim 20, wherein:

said preferred portion of said first magnetic region comprises a region wherein each of the two magnetic states can be dependably predicted to be substantially uniform and opposite of one another.

22. The method of claim 20, wherein:

said limiting includes using an electrical interaction region formed to effect said magnetoresistive electrical interaction only through said preferred portion of said first magnetic region and not any remaining portion thereof.

23. The method of claim 22, wherein:

said electrical interaction region is formed to be electrically conductive proximate said preferred portion of said first magnetic region, and wherein said limiting further includes using electrical insulation formed to prevent said magnetoresistive electrical interaction through said remaining portion of said first magnetic region.

24. A method for accessing a magnetic data storage medium with an access element, comprising the method for accessing the magnetoresistive device of claim 20, wherein said magnetoresistive device comprises said access element.

25. A method for accessing a magnetic memory cell in a magnetic memory, comprising accessing a magnetoresistive device having a first magnetic region and a second magnetic region separated from said first magnetic region by a non-ferromagnetic region, wherein said first magnetic region and said second magnetic region are substantially laterally coextensive, and wherein said first magnetic region is changeable between at least two magnetic states, said accessing including limiting magnetoresistive electrical interaction caused by electrodes to a single preferred portion of said first magnetic region, wherein said magnetoresistive device comprises said magnetic memory cell.

26. A method for accessing a magnetoresistive device having a first magnetic region changeable between at least two magnetic states, and a second magnetic region separated from said first magnetic region by a non-ferromagnetic region, wherein said first magnetic region and said second magnetic region are substantially laterally coextensive, comprising:
    limiting magnetoresistive electrical interaction to a single preferred portion of said first magnetic region, wherein said magnetoresistive device comprises a magnetic tunnel junction device and wherein said magnetoresistive electrical interaction comprises electrical tunneling caused by electrodes.

27. A method for forming a magnetoresistive device, comprising:
    forming an electrical interaction region through which magnetoresistive electrical interaction, upon application of a primarily perpendicular application of current through said device using electrodes, will occur upon access of said device;
    forming a first magnetic layer changeable into each of at least two magnetic states proximate to, and larger than, said electrical interaction region such that upon said access said magnetoresistive electrical interaction will occur only through a single preferred portion of said first magnetic layer determined by the resultant position of the electrical interaction region proximate to which said larger first magnetic layer is formed; and
    forming a second magnetic layer, separated from the preferred portion of the first magnetic layer by a non-ferromagnetic layer, wherein said first magnetic layer and said second magnetic layer are substantially coextensive.

28. The method of claim 27, wherein said forming an electrical interaction region includes:
    decreasing an electrically insulative effect in a given region of an otherwise insulating region thereby forming said electrical interaction region in said given region.

29. The method of claim 28, wherein said decreasing the electrically insulative effect in said given region includes providing less electrical insulation in said given region.

30. The method of claim 27, wherein said forming the electrical interaction region includes:
    forming electrical insulation in areas at least partially around said electrical interaction region to prevent said magnetoresistive electrical interaction in said areas around said electrical interaction region.

31. The method of claim 30, wherein said forming electrical insulation includes depositing said insulation in said areas at least partially around said electrical interaction region.

32. A method for forming a magnetoresistive device, comprising:
    forming all electrical interaction region through which magnetoresistive electrical interaction, upon application of a primarily perpendicular application of current through said device using electrodes, will occur upon access of said device, and wherein said forming the electrical interaction region includes:
        forming electrical insulation in areas at least partially around said electrical interaction to prevent said magnetoresistive electrical interaction region in said areas around said electrical interaction region, wherein said forming electrical insulation includes ion implanting said areas at least partially around said electrical interaction region to convert said areas from an otherwise non- insulating material into an insulating material, while isolating said electrical interaction region from said ion implanting, thereby maintaining an electrically conductive characteristic of said electrical interaction region,
    forming a first magnetic layer changeable into each of at least two magnetic states proximate to, and larger than, said electrical interaction region such that upon said access said magnetoresistive electrical interaction will occur only though a preferred portion of said first magnetic layer determined by the resultant position of the electrical interaction region proximate to which said larger first magnetic layer is formed; and
    forming a second magnetic layer, separated from the first magnetic layer by a non-ferromagnetic layer.

33. A method for forming a magnetoresistive device, comprising:
    forming an electrical interaction region through which magnetoresistive electrical interaction will occur upon access of said device; and
    forming a first magnetic layer changeable into each of at least two magnetic states proximate to, and larger than, said electric interaction region such that upon said access said magnetoresistive electric interaction will occur only though a single preferred portion of said first magnetic layer determined by the resultant position of the electrical interaction region proximate to which said larger first magnetic layer is formed, wherein said magnetoresistive electrical interaction comprises electrical tunneling caused by electrodes and said electrical interaction region comprises an electric tunneling region; and
    forming a second magnetic layer, separated from said first magnetic layer by a non-ferromagnetic layer, wherein said first magnetic layer and said second magnetic layer are substantially laterally coextensive.

34. A method for forming a magnetic memory cell in a magnetic memory, the magnetic memory cell comprising a magnetoresistive device, the method comprising:
    forming an electrical interaction region though which magnetoresistive electrical interaction will occur upon access of said device using electrodes; and
    forming a first magnetic layer changeable into each of at least two magnetic states proximate to, and larger than, said electrical interaction region such that upon said access said magnetoresistive electrical interaction will occur only trough a single preferred portion of said first magnetic layer determined by the resultant position of the electrical interaction region proximate to which said larger first magnetic layer is formed; and
    forming a second magnetic layer, separated from said first magnetic layer by a non-ferromagnetic layer, wherein said first magnetic layer and said second magnetic layer are substantially laterally coextensive.

* * * * *